United States Patent [19]
Abe et al.

[11] Patent Number: 5,444,650
[45] Date of Patent: Aug. 22, 1995

[54] SEMICONDUCTOR PROGRAMMABLE READ ONLY MEMORY DEVICE

[75] Inventors: Hirofumi Abe, Okazaki; Tadashi Shibata, Toyokawa, both of Japan

[73] Assignee: Nippondenso Co., Ltd., Kariya, Japan

[21] Appl. No.: 188,335

[22] Filed: Jan. 25, 1994

[51] Int. Cl.[6] ............................................. G11C 17/16
[52] U.S. Cl. ................................. 365/96; 365/189.01; 365/225.7; 365/227; 257/529
[58] Field of Search .............. 365/96, 226.7, 189.01, 365/227; 257/529, 530, 665; 307/202.1

[56] References Cited

U.S. PATENT DOCUMENTS

| | | | |
|---|---|---|---|
| 4,210,875 | 7/1980 | Beasom | 330/261 |
| 4,272,753 | 6/1981 | Nicolay | 337/297 |
| 4,412,241 | 10/1983 | Nelson | 257/530 |
| 4,446,534 | 5/1984 | Smith | 365/225.7 |
| 4,903,111 | 2/1990 | Takemoto et al. | 365/96 |
| 5,058,059 | 10/1991 | Matsuo et al. | 365/96 |
| 5,258,453 | 11/1993 | Tsujimoto | 365/225.7 |
| 5,299,151 | 3/1994 | Ishihara et al. | 365/96 |
| 5,319,592 | 6/1994 | Nguyen | 365/96 |

FOREIGN PATENT DOCUMENTS 315345  2/1991  Japan .

Primary Examiner—Joseph A. Popek
Assistant Examiner—Tan Nguyen
Attorney, Agent, or Firm—Cushman, Darby & Cushman

[57] ABSTRACT

A programmable semiconductor memory cell is provided; which secures a sufficient output signal voltage margin and which also has reduced current dissipation and improved durability. To program the programmable semiconductor memory cell of this invention, a high write potential is applied to the high-level lead of a fuse and a selector transistor is turned on to blow the fuse. When reading the memory cell, high read potential is applied to the high-level lead of the fuse. Because an emitter and base of an output transistor are connected to both leads of the fuse, the output transistor is turned on when the fuse is blown and is turned off when the fuse is not blown. The output transistor outputs an amplified signal voltage to an output line.

16 Claims, 5 Drawing Sheets

PRIOR ART

SEMICONDUCTOR PROGRAMMABLE READ ONLY MEMORY DEVICE

BACKGROUND OF THE INVENTION

1. Field of the Invention

The present invention relates to an electrically writable programmable semiconductor memory cell.

2. Description of the Related Art

Japanese Patent Publication No. 3-15345 (Kokoku) discloses an electrically writable programmable semiconductor memory cell which trims resistance by blowing a fuse to adjust the output voltage to the reference voltage.

As shown in FIG. 5, this circuit has an inverter circuit equipped with a load element (depletion MOS transistor) 91, a fuse 92, and a selector switch (enhancement MOS transistor) 93 in sequential serial connection an output line L5 connected to the connection between the load element 91 and the fuse 92 outputs at a high level if the fuse has been blown and at a low level when if the fuse has not been blown. Writing (blowing the fuse) is carried out by applying a high write voltage to the fuse 92 via the load element 91 with the selector switch 93 on, and reading is carried out by applying a lower voltage to the fuse 92 via the load element 91 with the selector switch 93 on.

With the above-mentioned programmable semiconductor memory cell of the prior art, there is a need to reduce the load current in order to reduce current dissipation. Reduction of the load current requires a reduction of the circuit's power supply voltage or an increase in the resistance of the load element, but a reduction in the circuit's power supply voltage—i.e., the voltage of the high-level line for read operations (normally +5 V)—is difficult to achieve because of considerations such as compatibly interfacing with other circuits, output voltage amplitude, and general utility of the device. Therefore, an increase in the resistance of the load element becomes necessary.

However, increasing the resistance of the load element causes a drop in the high-level of the output voltage determined by the ratio of this resistance to the resistance after the fuse has blown, which approaches the threshold voltage (i.e., the boundary voltage between the high-level output voltage when the fuse is blown and the low-level output voltage when the fuse is not blown) and thus a reduction in the voltage margin (i.e., the output voltage amplitude), resulting in a problem of reduced reliability.

Additionally, it is .possible to reduce the above-mentioned power supply voltage without giving consideration to matters such as interfacing with other circuits, but such a reduction in the power supply voltage also causes a reduction in the voltage margin similar to that described above, resulting in reduced reliability.

A second problem of the above-mentioned programmable semiconductor memory cell of the prior art is that because a large voltage is applied to the fusible area of the fuse during read operations, crystal growth occurs on the fused surface of the fuse, and with prolonged use a phenomena such as a decline in fuse resistance and electrical shorting occur, further reducing reliability.

SUMMARY OF THE INVENTION

In light of the above-mentioned problem points, an object of the present invention is to provide a programmable semiconductor memory device which ensures a sufficient output signal voltage margin, and which enables a reduction in current dissipation as well as an improvement in durability.

To accomplish the above object, the programmable semiconductor memory device according to this invention includes a high-level line, a low-level line, a fuse inserted between the high-level line and the low-level line, a selector transistor connected in series to the fuse, a load element connected in series to the fuse during read operation of the memory device, an output transistor whose base is connected to a connection of the load element and the fuse and whose collector is connected to the output line, and an emitter potential-setting means which forward-biases the base-emitter junction of the output transistor at a voltage substantially equal to a voltage developed across the fuse during a read operation of the memory device.

During the write operation (fuse blowing), the programmable semiconductor memory device of this invention applies a high potential for writing to the fuse by switching on the selector transistor, thereby blowing the fuse. During the read operation, the fuse and load element are connected in series. Here, the emitter-base junction of the output transistor is forward-biased by the emitter potential-setting means at a voltage substantially equal to the voltage at both leads of the fuse. For this reason, the output transistor is turned on when the fuse is blown, and is turned off when the fuse is not blown because of a substantial short between the emitter and base. A signal voltage amplified to a large amplitude is then output to the output line from the collector of the output transistor.

Briefly, with this memory device, the p-n junction between the emitter and base of the output transistor functions as the threshold voltage to the voltage (determined by the ratio of fuse resistance to load element resistance) of both leads of the fuse, and a reliable discrimination between blown and non-blown states as well as output signal voltages of large amplitudes can be obtained even when the change in voltage at the leads of the fuse between times of blowing and non-blowing is small. In other words, because this memory device has a high margin, the times of blowing and non-blowing are reliably discriminated between even if the resistance of the load element is high and the above-mentioned change in voltage at the leads of the fuse is compressed.

Furthermore, this invention provides a configuration whereby the p-n junction between the emitter and base of the output transistor is connected in parallel to both leads of the fuse, and when the p-n junction between the emitter and base of the output transistor is turned on, a voltage higher than this on voltage (approx. 0.7 V) is never applied to the leads of the fuse.

Because the programmable semiconductor memory device of this invention adopts a structure whereby the output lead of the fuse circuit in which the load element and fuse are connected in series is connected to the base of the output transistor, and the emitter of this output transistor is connected in parallel to the fuse only in a read state, as has been described above, the following benefits can be demonstrated.

Because the amplitude of the voltage at both fuse leads is determined, amplified, and output by using the p-n junction between the emitter and base of the output transistor, a reliable determination as an well as of a large-amplitude output voltage can be carried out even when the voltage differential between blowing and non-blowing is small. Additionally, because a small voltage differential between blowing and non-blowing is acceptable, it is possible to curtail current dissipation by means such as reducing the voltage applied between the fuse and load element when reading or by increasing the resistance of the load element, thereby enabling a low-power design and a suppression of an increase in temperature.

In addition, because no voltage exceeding the on voltage (approx. 0.7 V) of the p-n junction between the emitter and base of the output transistor is ever applied to the fuse leads when being read, and the current conducted through the fuse is therefore also low, there is no crystal growth on the blown surfaces of the fuse, and long-term reliability is enhanced.

DETAILED DESCRIPTION OF THE EMBODIMENTS

Embodiment 1

Figure 1:
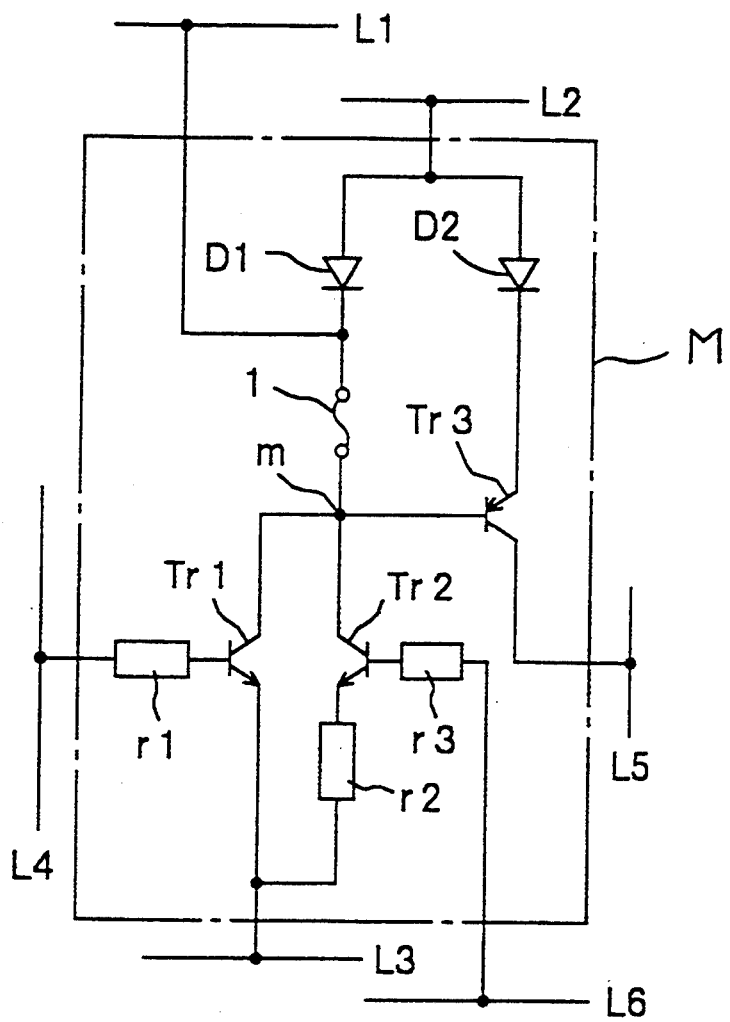
FIG. 1 shows a schematic circuit diagram of Embodiment 1 of the present invention.

FIG. 1 shows a programmable semiconductor memory cell of the first embodiment of this invention.

This programmable semiconductor memory cell M is composed of diodes D1 and D2, fuse 1, transistors Tr1, Tr2, and Tr3, and resistors r1, r2, and r3.

The high-level lead of fuse 1 is directly connected to the high-level write line L1, and also to the cathode of diode D1. The anode of diode D1 is connected to the high-level read line L2, and the high-level read line L2 is connected to the anode of diode D2.

During a read operation of the memory device, L2 forms the high-level line and is set to a high-level read potential, i.e., 5 volts.

During a write operation of the memory device, the high-level lead of the fuse has a write-potential applied, i.e., (several tens of volts). The cathode of diode D2 is connected to the emitter of transistor Tr3 (referred to as the output transistor of this invention), the base of transistor Tr3 is connected to the low-level lead of fuse 1, and the collector of transistor Tr3 is connected to the output line L5.

Meanwhile, the low-level lead of fuse 1 is connected to the collectors of transistors Tr1 and Tr2, the base of transistor Tr1 (referred to as the selector transistor of this invention) is connected to the first selector line L4 through resistor r1, and the emitter of transistor Tr1 is connected to the low-level line L3. Also, the emitter of transistor Tr2 is connected to the low-level line L3 through resistor r2, and the base of transistor Tr2 is connected to the second selector line L6 through resistor r3.

Transistors Tr1 and Tr2 are npn bipolar transistors, transistor Tr3 is a pnp bipolar transistor. Fuse 1 is a thin-film resistor with a thickness of several hundred Angstroms. The low-level line L3 is operated at 0 V, and the high-level read line L2 is operated at +5 V.

Following is a description of the operation of this programmable semiconductor memory cell M.

The blowing (one-level write operation) of fuse 1 is explained first.

First, transistor Tr2 is cut off with L6 set at a low level, then after applying several tens of volts to the high-level write line L1, the first selector line L4 is set to a high level. As a result, because transistor Tr1 is switched on and saturated, its collector is virtually at zero, the high write voltage (several tens of volts) described above is applied to the high-level lead of the fuse 1, which is closest to the high-level line, and fuse 1 blows. Diode D1 functions to isolate the high-level read line L2 from the high-level write line L1.

FIG. 1 shows one unit of a memory cell M, but a plurality of memory cells of identical configuration are connected to each of the lines. Moreover, each memory cell is capable of X-Y address selection for writing using the first selector line L4 and the high-level write line L1. For this reason, one-level write is not performed for memory cells at which the high-level write line L1 is not at high write voltage, or for memory cells at which the first selector line L4 is not at high level (i.e., zero level is written).

In cases where memory capacity is small, the high-level write lines L1 are all made common, a number of the first selector lines L4 equal to the number of memory cells are provided, and the memory cell selection is carried out by selecting the first selector line of each cell (i.e., by specifying the X address).

Next is a description of the read operation of this memory cell M.

First, the high-level write line L1 is isolated from the write power supply and enters a floating state, and the first selector line L4 is set to low level (here, 0 V), cutting off transistor Tr1. Meanwhile, the second selector line L6 is set to high level (here, +3.5 V), switching on transistor Tr2. Also, +5 V is applied to the high-level read line L2, and the output line L5 is grounded through the line load (not illustrated; moreover, this may be designed to conduct only at read).

Here, the memory cell array of this embodiment is configured for batch reading of the data stored by the blown/non-blown state of the fuse for each of the memory cells. That is to say, when reading, the lines L4, L6, L2, and L3 for the cells are respectively common between all memory cells, whereas the output lines L5 are arranged for each cell.

In addition to this, it is also possible to wire the second selector line L6 to form a pair with the first selector line L4 and enable both the second selector line L6 and the high-level read line L2 to be selected for each memory cell, thereby enabling X-Y address selection for the memory array and allowing memory data to be read in a time series. In this case, the low-level line L3 and the output line L5 can be common for each cell. Moreover, in cases of small memory capacity, it is also acceptable to make the high-level read lines L2 common for all cells and specify only the X address.

When the fuse 1 has been blown, the potential of connection m drops because transistor Tr2 is switched on during read operations transistor Tr3's base current ib is supplied from connection m, transistor Tr3 is turned on, and the collector of transistor Tr3 goes high. Here, if the voltage drop of diode D2 and the voltage drop between the emitter and base of transistor Tr3 are each approximately 0.75 V, the potential at connection m is approximately 3.5 V.

In this embodiment, meanwhile, the base and collector of transistor Tr2 are set at an equal potential, and the base is also set at approximately 3.5 V. For this reason, the emitter goes to approximately 2.8 V, and the resistance of resistor r2 is roughly equal at 2.8/ib.

Furthermore, if the current gain factor of transistor Tr2 is taken to be $\alpha$, the base current of transistor Tr2 is approximately ib/$\alpha$.

In brief, when fuse 1 blows, current dissipation is the sum of transistor Tr2's base current and collector current, and so current dissipation can be made extremely small.

Next is a description of the case when fuse 1 has been not blown.

The low-level lead, i.e. connection m, of fuse 1 becomes approximately 4.25 V because of the drop of diode D1, whereas the emitter of transistor Tr3 becomes approximately 4.25 V because of the drop of diode D2, the potential difference between the emitter and base of transistor Tr3 becomes approximately 0 V, and transistor Tr3 is cut off.

Because the operating state of transistor Tr2 (i.e., the currents of each of the areas) is determined by resistors r2 and r3, in this case as well the collector potential only rises from approximately 3.5 V to approximately 4.25 V, the current flowing through fuse 1 is equal to the base current of transistor Tr2, and as a result current dissipation is low.

Following is a description of other features of this embodiment.

In this embodiment, because transistor Tr3 changes from the cut off state to the on state by the fluctuation in potential of connection m due to the non-blown or blown state of fuse 1—in other words, because the potential of connection m is made binary using a steep threshold voltage of transistor Tr3, there is sufficient operation even when the fluctuation in potential of connection m is small (approx. 0.75 V), and so the resistance of resistor r2 (the load element of this invention) can be set high (i.e., current can be set low), thereby curtailing current dissipation. In the prior art, such a high-impedance value for the load element leads to a reduction in the output voltage amplitude due to the closeness of the resistance of fuse 1 after blowing to the resistance of the load element, which can cause faulty operation.

In this embodiment, moreover, because a voltage higher than approximately 0.75 V is not applied to fuse 1 after blowing, it is possible to prevent problems such as a drop in resistance and a reduction of reliability due to the growth of crystals from the blown end of fuse 1.

In this embodiment, diode D2 functions as a level-shift diode for dropping (level-shifting) the emitter of transistor Tr3 together with the voltage drop of diode D2, as well as functioning as a blocking diode for preventing a breakdown in the emitter-base junction of transistor Tr3 in the event that high voltage is applied to the base of transistor Tr3 for blowing.

Furthermore, in the embodiment described above the load element is made a constant current source using resistor r2 and transistor Tr2, but it is acceptable to employ a current mirror circuit or the like instead.

Embodiment 2

Figure 2:
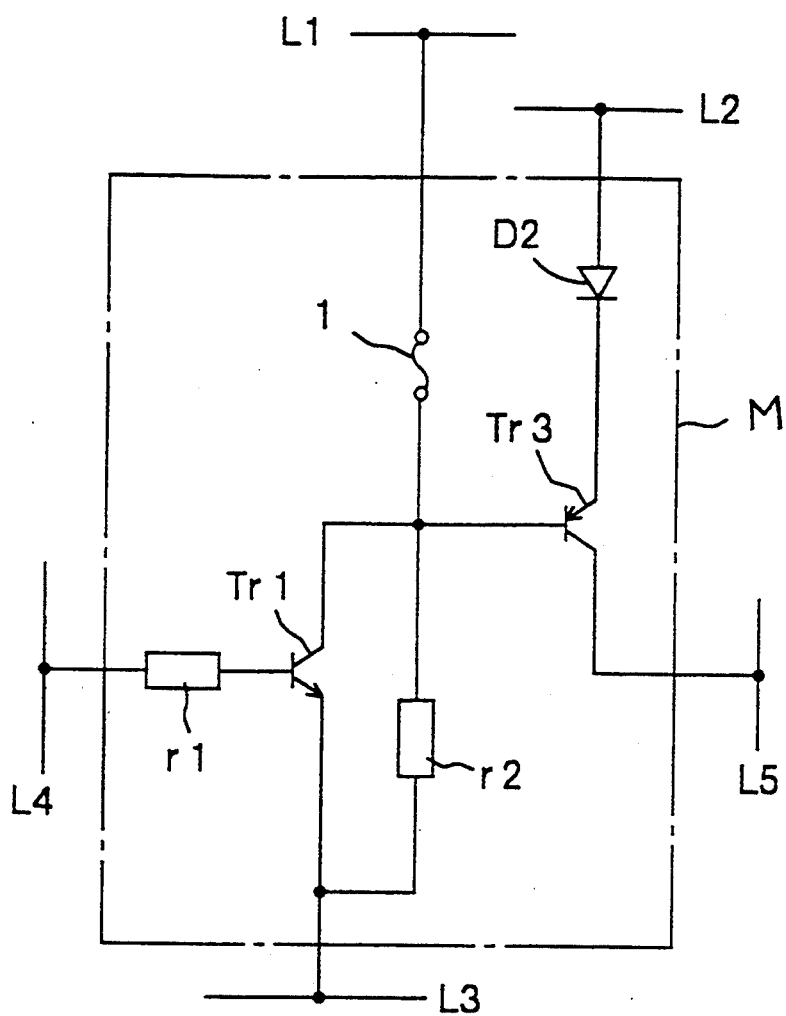
FIG. 2 shows a schematic circuit diagram of Embodiment 2 of the present invention.

FIG. 2 shows a programmable semiconductor memory cell of the second embodiment.

In this embodiment, diode D1 of FIG. 1 is omitted.

The write operation (blowing of fuse 1) is accomplished by setting the potential of the high-level write line L1 to the high write voltage (several tens of volts), and when reading the high-level write line L1 is set to the same potential as the high-level read line L2 (+5 V).

In this embodiment, moreover, transistor Tr2 is omitted and the load element is composed only of resistor r2.

Benefits equivalent to those of the first embodiment described above can be obtained from this embodiment as well.

Embodiment 3

Figure 3:
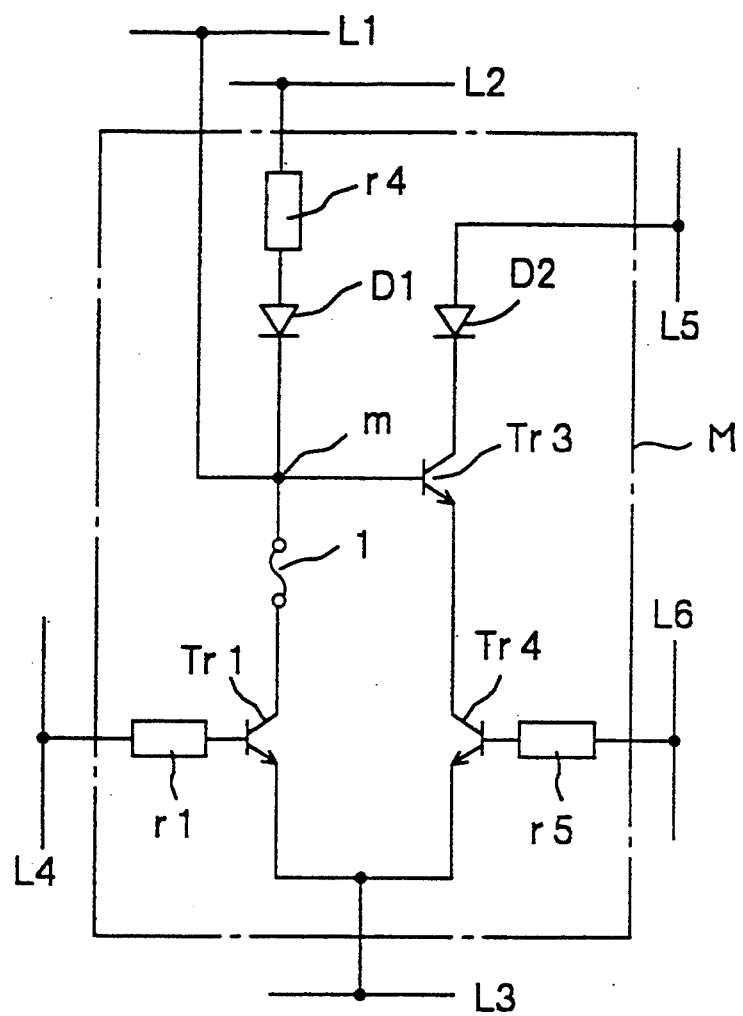
FIG. 3 shows a schematic circuit diagram of Embodiment 3 of the present invention.

FIG. 3 shows a programmable semiconductor memory cell of the third embodiment.

This programmable semiconductor memory cell M is composed of diodes D1 and D2, fuse 1, npn transistors Tr1, Tr3, and Tr4, and resistors r1, r4, and r5.

The high-level lead of fuse 1 is directly connected to the high-level write line L1, and also to the cathode of diode D1. The anode of diode D1 is connected to the high-level read line L2 through resistor r4. Connection m, which is the high-level lead of fuse 1, is connected to the base of transistor Tr3 (referred to as the output transistor of this invention), the collector of transistor Tr3 is connected to the cathode of diode D2, and the anode of diode D2 is connected to the output line L5. The emitter of transistor Tr3 is connected to the collector of transistor Tr4 (referred to as the second selector transistor of this invention), and the base of transistor Tr4 is connected to the second selector line L6 through resistor r5. The emitter of transistor Tr4 is connected to the low-level line L3 along with this emitter of transistor Tr1 (referred to as the first selector transistor of this invention).

The low-level lead of fuse 1 is connected to the collector of transistor Tr1, and the base of transistor Tr1 is connected to the first selector line L4 through resistor r1.

A voltage of 0 V is applied to the low-level line L3, +5 V is applied to the high-level read line L2, and +5 V is applied to the output line L5 through the line load (not illustrated). In addition, it is also acceptable to apply +5 V to the output line L5 through the line load (not illustrated) only at read.

Following is a description of the operation of this programmable semiconductor memory cell M.

The blowing operation (one-level write operation) of fuse 1 is explained first.

First, the second selector line L6 is taken to low level to cut off transistor Tr4, the first selector line L4 is taken to high level (here, +5 V), and high write voltage (several tens of volts) is applied to the high-level write line L1. As a result, transistor Tr1 is turned on and saturated, its collector is virtually at zero, the high write voltage described above is applied to fuse 1, and fuse 1 blows. Diode D1 has the function of isolating the high-level read line L2 from the high-level write line L1, and diode D2 has the function of isolating the output line L5 from the high-level write line L1.

Next is an explanation of the read operation of this memory cell M.

First, the high-level write line L1 is isolated from the write power supply and enters a floating state, the first selector line L4 is set to high level, and transistor Tr1 is switched on (saturation mode). The second selector line L6 is set to high level (here, +5 V), switching on transistor Tr4 (saturation mode). In this way, the low-level lead of fuse 1 becomes virtually 0 V, and the emitter of transistor Tr3 is also virtually at 0 V.

When fuse 1 has blown, connection m is isolated from the collector of transistor Tr1. Then, because the emitter of transistor Tr3 is at 0 V, its base receives current from the high-level read line L2 and is turned on, the collector of transistor Tr3 goes to low level (here, approx. 0 V), and the output line L5 becomes approximately 0.75 V because of the voltage drop of diode D2.

At this time, because resistor r4 alone supplies the base current for transistor Tr3, the resistance may be set high. In brief, because connection m becomes approximately 0.75 V and the low-level lead of resistor r4 becomes approximately 1.45 V, the resistance of resistor r4 becomes 3.55 V/ib, and its current dissipation is small.

Next is an explanation of the case when fuse 1 has not blown.

When fuse 1 has not blown, transistor Tr1 is on (saturation mode) and absorbs the current of resistor r4, connection m goes to approximately 0 V because transistor Tr1 is switched on, the output transistor Tr3 is cut off, and the output line L5 is charged by the output line charging load not illustrated and goes to +5 V.

In the embodiment of FIG. 3, Tr4 forms an emitter potential setting means for the output transistor Tr3, and during a write operation of the memory device, the high-level line L1 is set at the write potential (i.e., several tens of volts).

In the embodiments of FIGS. 1 and 2, the fuse is arranged closer to the high-level side (high-level line) than is the load element. While in the embodiment of FIG. 3, the fuse is arranged closer to the low-level side (low-level line) than is the load element.

In the embodiments of FIGS. 1-3, the selector transistors Tr1, Tr2, Tr4 are located closer to the low-level side (low-level line) than is the fuse.

The programmable semiconductor memory cell M of the embodiment described above demonstrates the same benefits as the first embodiment, and because npn transistors can be employed for all transistors used (Tr1, Tr2, and Tr3), the production processes, cost, and level of integration can be greatly improved.

Figure 4:
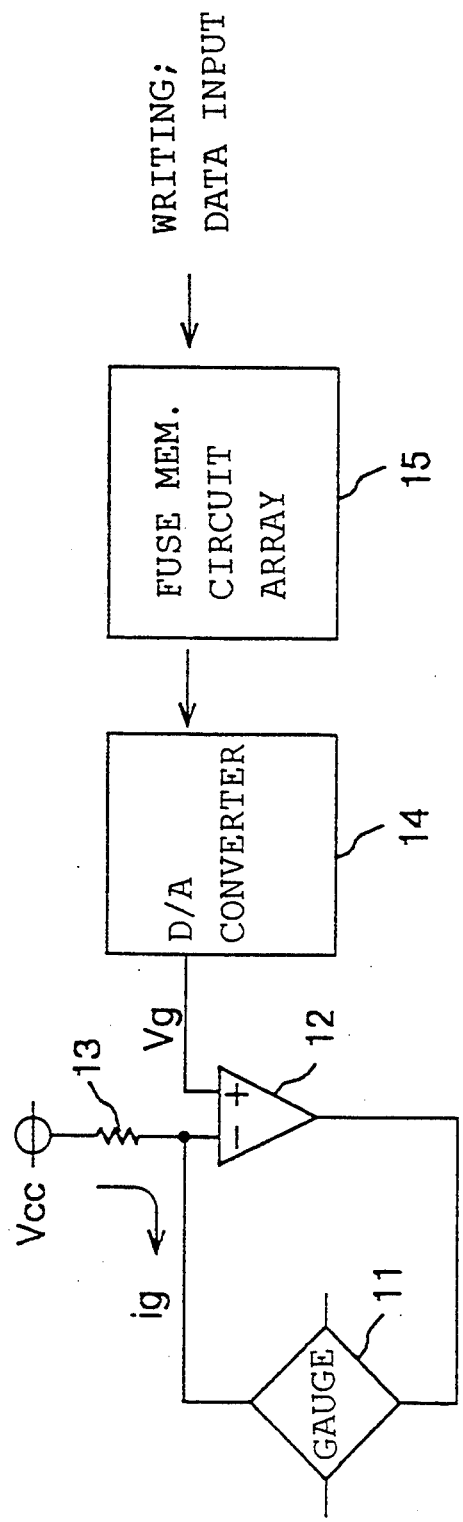
FIG. 4 shows a block diagram indicating an application of the memory cell.
Figure 5:
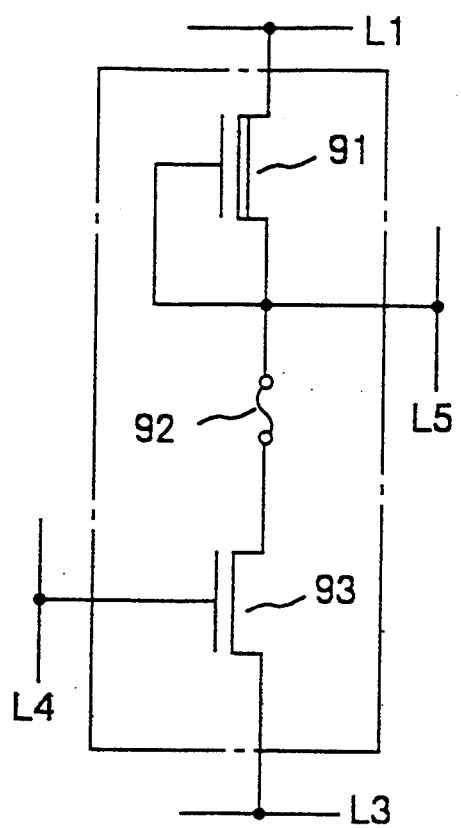
FIG. 5 shows the schematic diagram of a conventional programmable semiconductor memory cell.

Next is an explanation, with reference to FIG. 4, of the application of the programmable semiconductor memory cell M described above in the sensitivity adjustment circuit for a semiconductor pressure sensor.

In FIG. 4, the sensitivity adjustment circuit is composed of a fuse memory circuit array 15, a digital-to-analog (D/A) converter 14, and a reference current output circuit 13.

The fuse memory circuit array 15 is composed of an array of the programmable semiconductor memory cells M described above, and this embodiment has a small capacity of, for example, 16 bits.

Using the method described above, each cell of the fuse memory circuit array 15 is written in advance with the predetermined data for sensitivity adjustment in binary form; by writing at input I a value of 1 or 0 to each bit (cell) in this fuse memory circuit array 15, the array 15 outputs the written binary digit to the D/A converter 14, and the D/A converter 14 outputs an analog voltage Vg to the positive input lead of the operational amplifier 12 according to the binary digit. Vcc is applied to the negative lead of the operational amplifier 12 through the resistor 13 whose resistance is known, and the two input leads IG1, IG2 of the distortion-sensing element bridge (gauge) 11 are connected to the negative input lead and output lead, respectively, of the operational amplifier 12. For this reason, the reference current ig;

$$ig = (Vcc - Vg)/r13,$$

is supplied to the gauge 11. Here, r13 is the resistance of resistor 13.

If the reference current ig is set to the optimal reference current Ig so that the output sensitivity of the gauge 11 is optimized, this Ig is supplied to the gauge 11. Additionally, for this optimal reference current Ig, it is acceptable to apply the predetermined voltage to the gauge 11, regulate ig to measure the output voltage of the gauge 11, calculate in advance the ig value when the specified output voltage is obtained, and write this ig value to the array 15 as the predetermined data for sensitivity adjustment.

What is claimed is:

1. A semiconductor memory device comprising:
   a high-level line;
   a low-level line;
   a fuse inserted between said high-level line and said low-level line;
   a first selector transistor connected in series with said fuse;
   a load element connected in series with said fuse and conducting at least during a read operation of said memory device;
   an output transistor having a base connected to a connection between said load element and said fuse, and having a collector connected to an output line; and
   emitter potential-setting means for forward-biasing a base-emitter junction of said output transistor at a first voltage substantially equal to a second voltage developed across said fuse during said read operation of said memory device.

2. The semiconductor memory device according to claim 1, wherein current flows in a positive direction at said fuse before flowing through said load element.

3. The semiconductor memory device according to claim 2, wherein said first selector transistor is connected in parallel with said load element.

4. The semiconductor memory device according to claim 3, further comprising:
   means for setting said high-level line at a first high-level potential during said read operation of said memory device;
   wherein said emitter potential-setting means includes said high-level line.

5. The semiconductor memory device according to claim 4, further comprising:
   means for setting a first lead of said fuse at a second high-level potential during a write operation of said memory device.

6. The semiconductor memory device according to claim 5, further comprising:
   a first diode having a cathode connected to said first lead of said fuse and an anode connected to said high-level line; and
   a second diode having a cathode connected to an emitter of said output transistor and having an anode connected to said high-level line.

7. The semiconductor memory device according to claim 5, further comprising:

a second diode having a cathode connected to an emitter of said output transistor and having an anode connected to said high-level line.

8. The semiconductor memory device according to claim 1, wherein current flows in a positive direction at said load element before flowing to said fuse.

9. The semiconductor memory device according to claim 8, wherein current flows in a positive direction through said fuse before flowing through said first selector transistor.

10. The semiconductor memory device according to claim 9, wherein said emitter potential-setting means includes said low-level line.

11. The semiconductor memory device according to claim 8, further comprising:
a first diode having an anode connected to said high-level line and having a cathode connected to said fuse; and
a second diode having a cathode connected to said collector of said output transistor and having an anode connected to said output line.

12. The semiconductor memory device according to claim 11, wherein current flows in a positive direction at said fuse before flowing through said first selector transistor.

13. The semiconductor memory device according to claim 12, further comprising:
a second selector transistor which conducts during said read operation of said memory device located between said emitter of said output transistor and said low-level line;
wherein said emitter potential-setting means includes said low-level line.

14. A semiconductor memory device comprising:
a high-level line;
a low-level line;
a fuse having a high-level lead connected to said high-level line;
a load element connected between a low-level lead of said fuse and said low-level line;
a selector transistor connected between said low-level lead of said fuse and said low-level line, and having a base connected to a selector line;
an output transistor having a base connected to said low-level lead of said fuse and having a collector connected to an output line; and
a diode connected between an emitter of said output transistor and said high-level line.

15. A semiconductor memory device comprising:
a high-level line;
a low-level line;
a selector line;
a load element having a high-level lead connected to said high-level line;
a fuse having a high-level lead connected to a low-level lead of said load element;
a selector transistor having a collector connected to a low-level lead of said fuse, having an emitter connected to said low-level line; and having a base connected to said selector line;
an output transistor having an emitter connected to said low-level line and having a base connected to said high-level lead of said fuse; and
a diode connected between said collector of said output transistor and an output line.

16. A semiconductor memory device comprising:
a high-level line to which is applied a first high-level potential during a read operation of said memory device;
a low-level line;
a fuse having a high-level lead connected to said high-level line and a low-level lead connected to said low-level line;
means for setting said high-level lead of said fuse at a second high-level potential during a write operation of said memory device, said second high-level potential being higher than said first high-level potential;
a first selector transistor connected in series with said fuse;
a load element connected in series with said fuse and conducting at least during said read operation of said memory device;
an output transistor having a base connected to a connection between said load element and said fuse and having a collector connected to an output line; and
emitter potential-setting means for forward-biasing a base-emitter junction of said output transistor at a first voltage substantially equal to a second voltage developed across said fuse during said read operation of said memory device.

* * * * *